(12) United States Patent
Nara et al.

(10) Patent No.: US 8,754,664 B2
(45) Date of Patent: Jun. 17, 2014

(54) INSPECTION METHOD AND DEVICE

(75) Inventors: Yasuhiko Nara, Hitachinaka (JP); Tohru Ando, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/810,512

(22) PCT Filed: Jul. 27, 2011

(86) PCT No.: PCT/JP2011/067095
§ 371 (c)(1),
(2), (4) Date: Jan. 16, 2013

(87) PCT Pub. No.: WO2012/014935
PCT Pub. Date: Feb. 2, 2012

(65) Prior Publication Data
US 2013/0112871 A1     May 9, 2013

(30) Foreign Application Priority Data

Jul. 29, 2010 (JP) ................................ 2010-170177

(51) Int. Cl.
*G01R 1/26* (2006.01)
*G01R 31/28* (2006.01)
(52) U.S. Cl.
CPC ........ *G01R 31/2887* (2013.01); *G01R 31/2891* (2013.01); *H01J 2237/20221* (2013.01)
USPC ................. 324/750.16; 324/750.22; 250/306; 250/307; 250/310; 382/141; 382/145; 382/151
(58) Field of Classification Search
CPC .......................... G01R 31/2887; G01R 31/2891
USPC ........ 250/306, 307, 310; 324/750.16, 754.01; 348/79, 80, 125; 382/141, 145, 151; 850/1–5, 9
See application file for complete search history.

(56) References Cited

U.S. PATENT DOCUMENTS 5,585,738 A * 12/1996 Kuji et al. ................. 324/750.19
5,640,101 A * 6/1997 Kuji et al. ................. 324/756.03
(Continued)

FOREIGN PATENT DOCUMENTS

JP    2000-147070 A    5/2000
JP      2002-40107 A    2/2002
(Continued)

OTHER PUBLICATIONS

Japanese language Written Opinion dated Aug. 30, 2011 (PCT/ISA/237 Form (Four (4) pages).

(Continued)

*Primary Examiner* — Jack Berman
*Assistant Examiner* — Kevin Chung
(74) *Attorney, Agent, or Firm* — Crowell & Moring LLP (57) ABSTRACT

The high magnification, high resolution and real-time property of an SEM image are realized when the electrical characteristics of an inspection object are measured, without affecting the electrical characteristics of the inspection object. A high-quality, high-magnification first image including an image of a target position in the inspection object on a sample is acquired. Next, a low-quality, low-magnification second image including the image of the target position in the inspection object on the sample and probe images is acquired. Next, data on the first image is built into the second image to generate an image for coarse-access observation which is the same in magnification as the second image. The generation of the image for coarse-access observation is repeated until a probe comes close to the target position in the inspection object.

20 Claims, 8 Drawing Sheets

(56) References Cited

U.S. PATENT DOCUMENTS

| | | | |
|---|---|---|---|
| 6,267,674 B1* | 7/2001 | Kondo et al. | 463/32 |
| 6,415,038 B1* | 7/2002 | Kaneko et al. | 382/100 |
| 7,110,586 B2* | 9/2006 | Bacus et al. | 382/128 |
| 7,538,564 B2* | 5/2009 | Ehrmann et al. | 324/754.23 |
| 7,784,107 B2* | 8/2010 | Kley | 850/4 |
| 2003/0042921 A1* | 3/2003 | Hollman | 324/754 |
| 2003/0184332 A1 | 10/2003 | Tomimatsu et al. | |
| 2005/0139781 A1 | 6/2005 | Hazaki et al. | |
| 2005/0140379 A1 | 6/2005 | Furukawa et al. | |
| 2006/0087330 A1* | 4/2006 | Saito et al. | 324/750 |
| 2006/0215901 A1* | 9/2006 | Nakagaki et al. | 382/149 |
| 2007/0124713 A1* | 5/2007 | Ando et al. | 716/5 |
| 2007/0176612 A1* | 8/2007 | Sakata | 324/754 |
| 2008/0048699 A1* | 2/2008 | Hazaki et al. | 324/758 |
| 2008/0258061 A1* | 10/2008 | Douglass et al. | 250/311 |
| 2009/0141126 A1* | 6/2009 | Soenksen | 348/79 |

FOREIGN PATENT DOCUMENTS

| | | |
|---|---|---|
| JP | 2002-343843 A | 11/2002 |
| JP | 2005-189239 A | 7/2005 |
| JP | 2005-210067 A | 8/2005 |
| JP | 2007-189113 A | 7/2007 |
| JP | 2008-281535 A | 11/2008 |
| WO | WO 2010/089960 A1 | 8/2010 |

OTHER PUBLICATIONS

International Search Report including English translation dated Aug. 30, 2011 (Four (4) pages).

* cited by examiner

INSPECTION METHOD AND DEVICE

TECHNICAL FIELD

The present invention relates to an inspection method and an inspection device for inspecting an inspection object by bringing a probe into contact with the inspection object.

BACKGROUND ART

Patent Literature 1 describes a technique of bringing a probe into contact with a semiconductor device and measuring the electrical characteristics thereof, in order to detect defects in the wiring lines of the semiconductor device. In order to precisely measure the electrical characteristics of the semiconductor device, the probe has to be brought into contact with a predetermined position of the semiconductor device. Hence, SEM images based on a scanning electron microscope (SEM) are used.

In recent years, there has been a progress in the miniaturization of the wiring pattern of a semiconductor device, as seen in 30 nm and 20 nm devices. For example, contacts of a transistor cannot be observed in the most-advanced semiconductor device unless a magnification of 20,000 to 30,000 is applied. Accordingly, there is the need for high-magnification, high-resolution SEM images.

In order to increase the magnification and resolution of SEM images, electron optical conditions (acceleration voltage, emission current, and the like of an electron beam) need to be changed. If the electron optical conditions are changed, however, a sample may suffer damage, thus affecting the electrical characteristics of a semiconductor device. Accordingly, in addition to increasing the magnification and resolution of SEM images, it is essential to avoid affecting the electrical characteristics of the semiconductor device. These two objectives are in a trade-off relationship, however.

In a step of bringing a probe into contact with a semiconductor device (probe needle contact), information on the current position of the probe needs to be acquired. That is, the real-time property of an SEM image is required.

CITATION LIST

Patent Literature

Patent Literature 1:JP Patent Publication (Kokai) No. 2002-343843 A

SUMMARY OF INVENTION

Technical Problem

As described above, in the step of bringing the probe into contact with the semiconductor device (probe needle contact), an SEM image not only needs to be made high in magnification and resolution but also needs to have a real-time property. It has been difficult for any related art, however, to satisfy requirements for the high magnification and high resolution of an SEM image and the real-time property thereof at the same time, without affecting the electrical characteristics of the semiconductor device.

An object of the present invention is to provide a technique capable of simultaneously satisfying requirements for the high magnification and resolution and the real-time property of an SEM image at the time of measuring the electrical characteristics of the inspection object, without affecting the electrical characteristics thereof.

Solution to Problem

According to the present invention, there is first acquired a high-quality, high-magnification first image including an image of a target position in an inspection object on a sample. Next, there is acquired a low-quality, low-magnification second image including the image of the target position and probe images in the inspection object on the sample. Next, data on the first image is incorporated into the second image, thereby generating an image for coarse-access observation the same in magnification as the second image. The generation of the image for coarse-access observation is repeated until a probe comes close to the target position in the inspection object.

In addition, a low-quality, low-magnification third image including the image of the target position in the inspection object on the sample and probe images is acquired. Next, data on the third image and the first image are synthesized, thereby generating an image for fine-access observation the same in magnification as the first image. The generation of the image for fine-access observation is repeated until the probe comes into contact with the target position in the inspection object.

Advantageous Effect of the Invention

According to the present invention, it is possible to satisfy requirements for the high magnification and resolution and the real-time property of an SEM image at the time of measuring the electrical characteristics of an inspection object, without affecting the electrical characteristics thereof.

DESCRIPTION OF EMBODIMENTS

Figure 1:
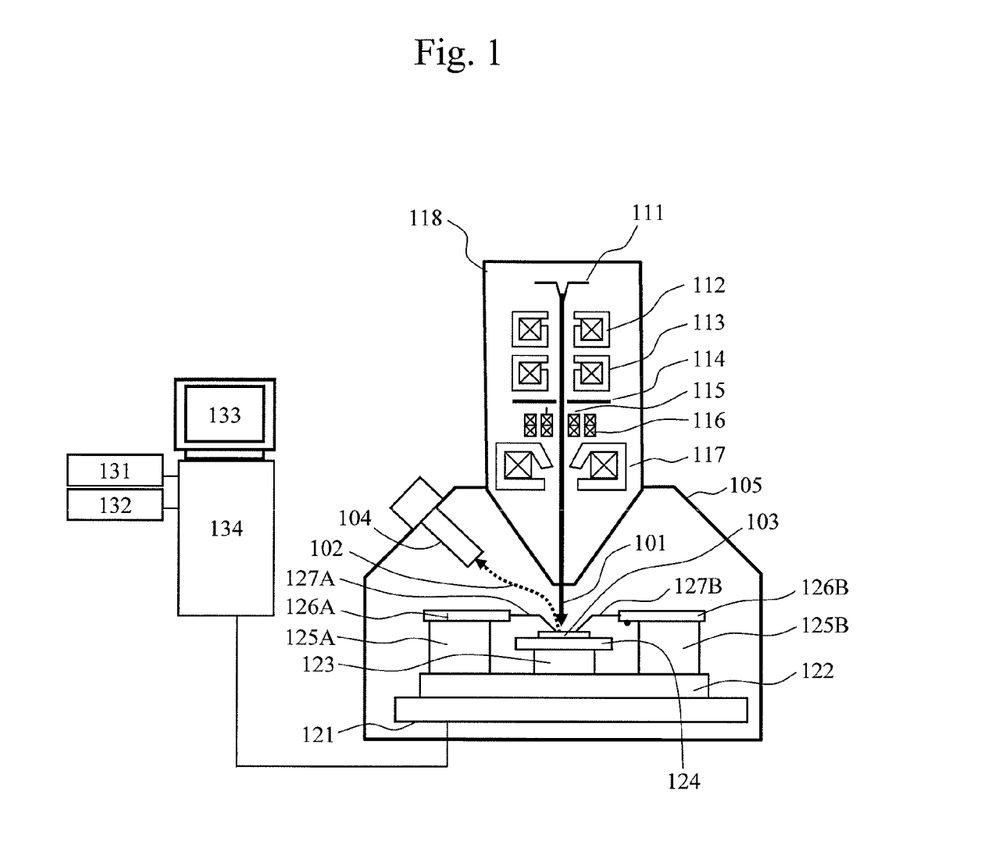
FIG. 1 is a drawing illustrating a configuration example of an inspection device of the present invention.

A semiconductor inspection device will be described as an embodiment of an inspection device according to the present invention with reference to FIG. 1. In the semiconductor inspection device, probes are directly brought into contact with a circuit pattern formed on a semiconductor device which is a sample, thereby measuring the logical operation and the electrical characteristics of a circuit. A scanning electron microscope (SEM: Scanning Electron Microscope) is provided in order to confirm a state and a position of contact between the sample and a probe. Here, a description will be given of an embodiment of an SEM-based semiconductor inspection device provided with a scanning electron microscope. Alternatively, however, the semiconductor inspection device of the present invention may be one using another charged particle beam unit.

The semiconductor inspection device of the present embodiment includes an electron-beam optical system 118 and a sample chamber 105. The electron-beam optical system 118 is provided on an enclosure of the sample chamber 105. The sample chamber 105 is provided with a sample stage 124 to be mounted with a sample 103, a sample stage driving unit 123 for driving the sample stage 124, probe attachments 126A and 126B for supporting probes 127A and 127B, probe driving units 125A and 125B for driving the probe attachments 126A and 126B, a large stage 122 for supporting the sample stage driving unit 123 and the probe driving units 125A and 125B, and a base 121 for supporting the large stage 122. A detector 104 is further provided in the enclosure of the sample chamber 105.

The SEM-based semiconductor inspection device of the present embodiment further includes an image processing unit 131, a storage device 132, a display unit 133, and a control computer 134. As will be described hereinbelow, SEM images for coarse access mode observation and SEM images for fine access mode observation are generated by the image processing unit 131.

The control computer 134 performs the operation control of the semiconductor inspection device as a whole, such as magnification switchover, stage movement and SEM image generation, by utilizing the image processing unit 131, the storage device 132, and the display unit 133.

The SEM-based semiconductor inspection device of the present embodiment may be provided with an automatic probing function for automatically moving the probes 127A and 127B and bringing the probes into contact with the sample 103. Alternatively, however, the probes 127A and 127B may manually be moved and brought into contact with the sample 103.

The electron-beam optical system 118 includes an electron gun 111, condenser lenses 112 and 113, an aperture diaphragm 114, a scan deflector 115, an image shift deflector 116, and an objective lens 117. A scanning direction and a magnification can be determined using the scan deflector 115. The electron-beam optical system 118 may include only one condenser lens.

The operation of the semiconductor inspection device of the present embodiment will be described. First, a control signal from the control computer 134 is transmitted to the sample stage driving unit 123 and the probe driving units 125A and 125B. The control signal changes the positions of the probes 127A and 127B relative to the position of the sample 103 and, thereby, brings the probes 127A and 127B into contact with the sample 103. Electrical signals from the probes 127A and 127B are sent to the control computer 134. The control computer 134 analyzes the signals from the probes. The display unit 133 displays a graph or a table representing analysis results.

On the other hand, in the electron-beam optical system 118, a primary electron beam 101 from the electron gun 111 passes through the condenser lenses 112 and 113, the aperture diaphragm 114, the scan deflector 115, the image shift deflector 116, and the objective lens 117, and is irradiated to the sample 103. A secondary electrical signal or a reflection electron signal from the sample 103 is detected by the detector 104, and an SEM image is generated by the image processing unit 131. This SEM image is displayed by the display unit 133 and stored on the storage device 132. This SEM image is utilized when the probes 127A and 127B are brought into contact with the sample 103.

According to the present invention, a probe needle contact is made using an image generated using a secondary electrical signal or a reflection electron signal. Alternatively, an image of an electrical current absorbed by a probe may be used to make the needle contact. This alternative method can actualize the difference of materials. Yet alternatively, a probe needle contact can be made using an image representing internal electrical conductivity.

The semiconductor inspection device of the present embodiment uses the electron-beam optical system 118, as described above. If a charged particle beam optical system is used alternatively, a probe needle contact can be made using an ion image. This alternative method improves operability for probe needle contact.

The semiconductor inspection device according to the present invention should basically be a probe-equipped inspection device capable of varying the acceleration voltage of a primary particle beam, changing the amount of probe current, and editing graphics.

Figure 2:
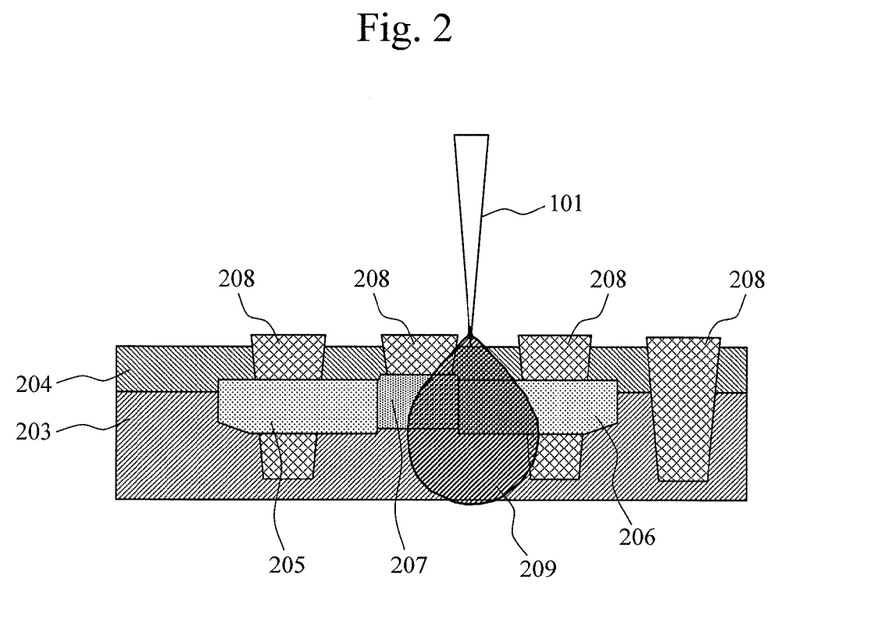
FIG. 2 is a drawing illustrating effects of electron beam irradiation on a transistor within a semiconductor device.

As an example of the sample 103, a commonly-used semiconductor device will be described with reference to FIG. 2. The semiconductor device includes a substrate 203 and an oxide film 204 thereon. Note that a surface of the semiconductor device has been polished and the uppermost-layer part of the oxide film 204 has been ground. In the semiconductor device, there are formed a drain 205, a source 206, and a gate 207 which are constituent elements of a transistor and to which contacts 208 are respectively connected. An upper end of each contact 208 is exposed through the oxide film 204. The electrical characteristics of the transistor can be inspected by bringing a probe into contact with the contact 208. Consequently, a determination can be made which transistor is defective.

When the primary electron beam 101 is irradiated to a surface of the semiconductor device in the scanning electron microscope, the electron beam penetrates into a predetermined region 209 within the semiconductor device. A part of the drain 205, the source 206, or the gate 207, if any, present in this electron beam penetrating region 209 affects the electrical characteristics of the transistor. That is, errors occur in the detection of defects in the transistor. For example, transistors are accompanied by the phenomenon that a drain current suddenly flows if a gate voltage exceeds a certain value Vth. The presence of the electron beam penetrating region 209 affects the rising edge of this Vth characteristic. In recent years, there has been a progress in the miniaturization of semiconductor devices and a contact-to-contact distance has become increasingly shorter. In addition, the oxide film 204 has been made increasingly thinner. Accordingly, the electron beam penetrating region, even if the same in size, is more liable to affect the drain 205, the source 206 and the gate 207 as the oxide film 204 becomes thinner.

What is required in order to reduce effects of the primary electron beam 101 on the drain 205, the source 206 and the gate 207 is making the electron beam penetrating region 209 as small as possible. In order to make the electron beam penetrating region 209 smaller, the acceleration voltage of the primary electron beam 101 should be decreased (for example, to 1.0 kV or less) or the emission current of the primary electron beam 101 should be decreased (for example, to 5 µA or less).

In addition, observations should be made at as low magnifications as possible or the electron beam should be prevented as much as possible from focusing on a surface of the semiconductor device. Yet additionally, charges should be prevented from accumulating on the surface of the semiconductor device by increasing a scan speed. Still additionally, it is also effective to make observations in the shortest possible length of time. Still additionally, the amount of oxide film to be abraded in the preprocessing of the semiconductor device should be reduced, in order to leave over the oxide film as much as possible.

These measures will degrade the quality or the resolution of SEM images, however. Accordingly, these measures are not effective in precisely and reliably bringing probes into contact with the surface of the semiconductor device. Upgrading the quality of SEM images enables a probe needle contact to be made precisely and reliably but causes the electron beam penetrating region 209 to become larger, thus affecting the electrical characteristics of the semiconductor device. Consequently, errors are liable to occur in defect inspection.

In general, reducing the size of the electron beam penetrating region 209 and acquiring high-quality SEM images are in a trade-off relationship. That is, precisely evaluating the electrical characteristics of a semiconductor device and acquiring high-quality SEM images are in a trade-off relationship.

Hence, according to the present invention, operability for probe needle contact is improved using two types of images, i.e., a high-quality, high-magnification image and a low-quality, low-magnification image. At the same time, the occurrence of damage due to electron beams is avoided. Note that acquiring a low-quality image is for the purpose of avoiding the occurrence of damage due to electron beams. Accordingly, a scan speed is increased.

As a condition for acquiring high-quality images, a selection can be made from a variety of parameters. Examples of these parameters include the acceleration voltage and irradiation current of an electron beam, a probe current, a scan time, the frequency of frame integration, the number of pixels, and a magnification. In addition, a high-quality image can also be acquired using a charged particle image, a reflected electron image or the like in place of a secondary electron image.

If there is the need for information on a surface of a sample in probe needle contact, an acceleration voltage should be made relatively low. In contrast, if there is the need for information on a lower portion of the sample, the acceleration voltage should be made relatively high. In addition, an image having a voltage contrast can be acquired by varying the amount of probe current. In either case, desired information can be obtained by selecting a condition for acquiring a high-quality image. Thus, the information should be utilized to make probe needle contact.

A method of probe movement in a semiconductor device inspection method according to the present invention will be described with reference to FIG. 3. A description will be given assuming that an inspection object is a transistor of a semiconductor device. In order to inspect the electrical characteristics of the transistor, probes are brought into contact with contacts of the transistor.

When a target contact image of the transistor appears in a field of view of the scanning electron microscope, the sample stage is moved so that the target contact image is positioned in the middle of the field of view. Thereafter, the sample stage is not moved. Although the sample is not moved thereafter, the probes are moved. Accordingly, a high-quality still image may be used to observe the target contact image, but a real-time image is needed to observe probe images.

The method of probe movement includes two modes, i.e., a coarse-access mode and a fine-access mode. In the coarse-access mode in which a probe is relatively distant from a target contact, the probe is moved while checking the position thereof by using a low-magnification SEM image. In the fine-access mode in which the probe is relatively close to the target contact, the probe is moved while checking the position thereof by using a high-magnification SEM image. The method of probe movement may be either automatic or manual. In the coarse-access mode, the moving speed or stroke of the probes should be made relatively high or large. In the fine-access mode, however, the moving speed or stroke of the probes should be made relatively low or small.

According to the present embodiment, a high-quality, high-magnification first SEM image is acquired and stored in the storage device 132 in step S101. In order to acquire a high-quality SEM image, the acceleration voltage or irradiation current of the electron beam may be increased, as described above. Alternatively, a scan speed may be decreased. At this point in time, the probe to be moved is relatively distant from the target contact. Accordingly, the target contact image is shown in the first SEM image, whereas the image of the probe to be moved is not shown. The coarse-access mode is initiated in step S102. That is, the probe is moved in the coarse-access mode.

A low-quality, low-magnification second SEM image is acquired in step S103 and stored in the storage device 132. In order to acquire a low-quality SEM image, a scan speed, for example, should be increased. Both the target contact image and the probe image being moved are shown in the second SEM image. Whereas in the high-image quality first SEM image, the electron beam is focused onto the sample, the electron beam may alternatively be focused on the probes in the low-quality second SEM image. This causes the target contact image to become blurred, but the probe image is clearly shown.

An SEM image for low-magnification coarse access mode observation is generated in step S104. The SEM image for coarse access mode observation is generated by incorporating the first SEM image acquired in step S101 into the second SEM image acquired in step S103. A method for generating the SEM image for coarse access mode observation will be described in detail later with reference to FIG. 4. Both the target contact image and the probe image being moved are shown in the SEM image for coarse access mode observation.

In step S105, a determination is made whether or not the coarse-access mode is terminated. If a determination can be made, by observing the SEM image for coarse access mode observation, that the probe image is not close to the target contact image, the method returns to step S103 to continue the coarse-access mode. Steps S103 and S104 are repeated until a determination can be made that the probe image is close to the target contact image. If a determination can be made, by observing the SEM image for coarse access mode observation, that the probe image is close to the target contact image, the method terminates the coarse-access mode. In this case, the fine-access mode is initiated in step S106. That is, the probe is moved in the fine-access mode.

A low-quality, low-magnification third SEM image is acquired in step S107 and stored in the storage device 132. Both the target contact image and the probe image to be moved are shown in the third SEM image. Note that optical conditions of the scanning electron microscope in the acquisition of the third SEM image in step S107 are the same as those of the scanning electron microscope in the acquisition of the second SEM image in step S103. That is, the optical conditions of the scanning electron microscope in the coarse-access mode are maintained as there are also in the fine-access mode.

An SEM image for high-magnification fine access mode observation is generated in step S108. The SEM image for fine access mode observation is generated by synthesizing the first SEM image acquired in step S101 and the third SEM image acquired in step S107. Note that a method for generating the SEM image for fine access mode observation will be described in detail later with reference to FIGS. 5, 6 and 7. Both the target contact image and the probe image to be moved are shown in the SEM image for fine access mode observation.

In step S109, a determination is made whether or not the fine-access mode is terminated. If a determination can be made, by observing the SEM image for fine access mode observation, that the probe image has not yet come into contact with the target contact image, the method returns to step S107 to continue the fine-access mode. Steps S107 and S108 are repeated until a determination can be made that the probe image has come into contact with the target contact image. If a determination can be made, by observing the SEM image for fine access mode observation, that the probe image has come into contact with the target contact image, the method terminates the fine-access mode. That is, probe movement is stopped.

Note that the determinations in steps S105 and S109 may be made visually by a user or the image processing unit 131 may automatically make the determinations by means of image processing. For example, in processing in step S105, the coarse-access mode is terminated when a distance between the probe image and the target contact image is shorter than a predetermined distance. On the other hand, in processing in step S109, the fine-access mode is terminated when the position of a leading end of the probe image substantially agrees with the position of the target contact image.

In the present embodiment, the second SEM image is acquired in step S103 each time a low-magnification SEM image for coarse access mode observation is generated. Likewise, the third SEM image is acquired in step S107 each time a high-magnification SEM image for fine access mode observation is generated. The second and third SEM images, even if generated repeatedly, are less likely to cause damage to surfaces of the sample, however, since these images are low in quality and magnification. On the other hand, the first SEM image is acquired only once in step S101. The first SEM image, though high in image quality and magnification, is acquired only once and is, therefore, less likely to cause damage to surfaces of the sample.

In addition, the electron beam is focused on a probe rather than on a contact when the second and third SEM images are acquired. Accordingly, the electron beam is not in focus on a surface of the semiconductor device which is the sample. Consequently, it is possible to reduce damage to be caused to the sample by electron beam irradiation.

Graphics editing, such as contrast emphasis, color display, and edge enhancement, may be performed on an SEM screen, in order to discriminate between the first SEM image acquired in step S101 and the second and third SEM images acquired in steps S103 and S107. Thus, the user can readily determine, on view of an SEM image displayed on the display unit, whether the SEM image is the initially-acquired first SEM image or the later-acquired second or third SEM image.

Such graphics editing should be performed on the first SEM image. The first SEM image, after being subjected to graphics editing, is stored in the storage device 132. In order to synthesize the first SEM image and the second and third SEM images, the first SEM image stored in the storage device 132 after having been subjected to graphics-editing should be utilized.

Alternatively, graphics editing may be performed so as to highlight a probe image placed in the latest position, and so as not to highlight a probe image placed in an earlier position in the SEM image for coarse access mode observation and the SEM image for fine access mode observation.

Contacts of a transistor cannot be precisely observed unless a high-quality, high-magnification SEM image is used. Accordingly, a high-quality, high-magnification SEM image is acquired in step S101, in order to obtain positional information on a target contact. Since there is no need to move the sample stage during probe needle contact, however, this high-quality, high-magnification SEM image may be acquired only once.

On the other hand, the probes are large in size and can therefore be observed even by using a low-quality, low-magnification SEM image. The probes are moved at the time of needle contact, however. Thus, a probe may collide with an adjacent probe and become damaged, unless observations are made in real time. Accordingly, the low-quality, low-magnification second and third SEM images are acquired regularly at predetermined time intervals, in order to obtain positional information on the probes. The second and third SEM images are therefore real-time images.

In the inspection of semiconductor devices, damage may be caused to a sample by electron beam irradiation in a step of probe needle contact. According to the present invention, however, damage to be caused to a sample by electron beam irradiation is minimized. In addition, according to the present invention, the fine-access mode is executed following the coarse-access mode. Thus, it is possible to shorten a probing time.

A method for generating a low-magnification SEM image for coarse access mode observation in step S104 of FIG. 3 will be described with reference to FIG. 4. An SEM image 2010 in the upper-left corner of FIG. 4 represents an example of the low-quality, low-magnification second SEM image 2010 acquired in step S103 of FIG. 3. An SEM image 1010 in the upper-right corner of FIG. 4 represents an example of the high-quality, high-magnification first SEM image 1010 acquired in step S101 of FIG. 3.

In the first SEM image 1010, a plurality of circles disposed in arrays represents contact images of a transistor. Since the first SEM image 1010 is high in quality, the target contact image 1020 is shown clearly. A first probe image 1030 is already placed in a predetermined position and stands still therein. A second probe image to be moved is not in view in this SEM image 1010.

Since the second SEM image 2010 is low in magnification, two probe images 2030 and 2040 are displayed. Although in the first SEM image 1010, the electron beam is focused on the sample, the electron beam may alternatively be focused on the probes in the second SEM image 2010. Consequently, the probe images 2030 and 2040 are displayed relatively clearly in the second SEM image 2010. On the other hand, it is difficult to identify all of the contact images in the second SEM image 2010. In addition, the target contact image 2020 is blurred, and therefore, it is not possible to precisely determine the position of the image. In the coarse-access mode, the second probe image 2040 is moved in the direction of an arrow.

First, the first SEM image 1010 is reduced to generate a high-quality, reduced image 1010a the same in magnification as the second SEM image 2010. Here, the magnification of the first SEM image 1010 is advantageously an integral multiple of the magnification of the second SEM image 2010.

The image-based dimensions of the target contact image 1020a and the first probe image 1030a included in this high-quality reduced image 1010a are the same as the image-based dimensions of the target contact image 2020 and the first probe image 2030 included in the second SEM image 2010.

Next, the high-quality reduced image 1010a is incorporated into the second SEM image 2010 to generate a low-magnification SEM image 2201 for coarse access mode observation. The corresponding pixel values of both images, for example, may be integrated in order to incorporate the reduced image 1010a into the second SEM image 2010.

In the SEM image 2201 for coarse access mode observation, not only the target contact image 2102a and the first probe image 2203 (2103a) but also the second probe image 2204 are displayed. A sharp image is displayed in a central region 2101a of the SEM image 2201 for coarse access mode observation, whereas a blurred image is displayed outside the central region 2101a. The target contact image 2102a is sharp since the image is located within the central region 2101a. Whereas a portion 2103a, among the portions of the first probe image, located within the central region 2101a is sharp, a portion 2203 located outside the central region 2101a is blurred. In addition, the second probe image 2204 is located outside the central region 2101a and is therefore blurred. In the second SEM image 2010, however, the electron beam is focused on the first and second probes. Accordingly, the first and second probe images 2030 and 2040 must be displayed relatively clearly. In addition, the second probe image 2204 is distant from the target contact image 2102a at the moment the second SEM image 2010 is acquired. Consequently, even if the second probe image 2204 is more or less unclear, the unclarity is not disadvantageous in determining whether or not the second probe image 2204 is close to the target contact image 2102a.

In the SEM image 2201 for coarse access mode observation, the first probe image 2203 (2103a) is not displayed with perfect precision. What is required in the SEM image 2201 for coarse access mode observation, however, is to be possible to precisely check that the second probe image 2204 is close to the target contact image 2102a. Thus, the first probe image need not necessarily be displayed with precision.

In the present embodiment, the second SEM image 2010 is acquired at predetermined time intervals to generate the low-magnification SEM image 2201 for coarse access mode observation. Consequently, it is possible to check that the second probe image 2204 is close to the target contact image 2102a.

Figure 4:
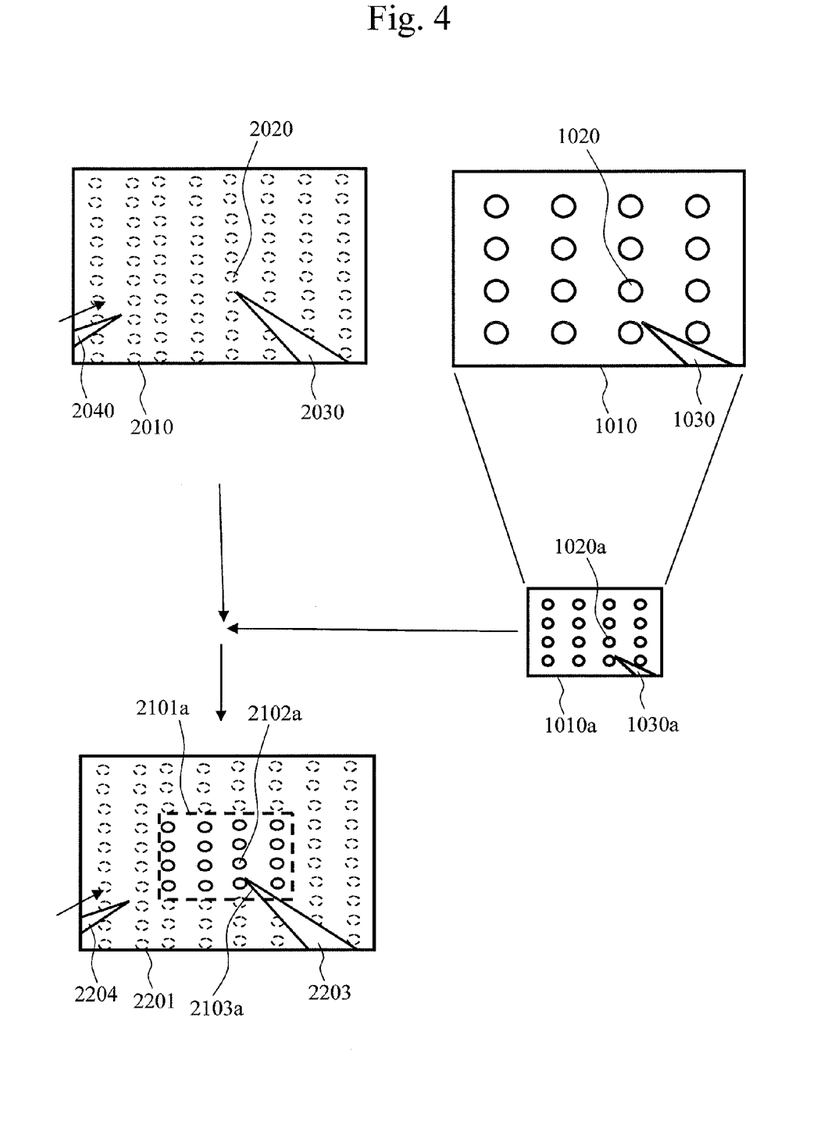
FIG. 4 is a drawing used to describe a method for generating a low-magnification SEM image for coarse access mode observation in the inspection method of the present invention.
Figure 5:
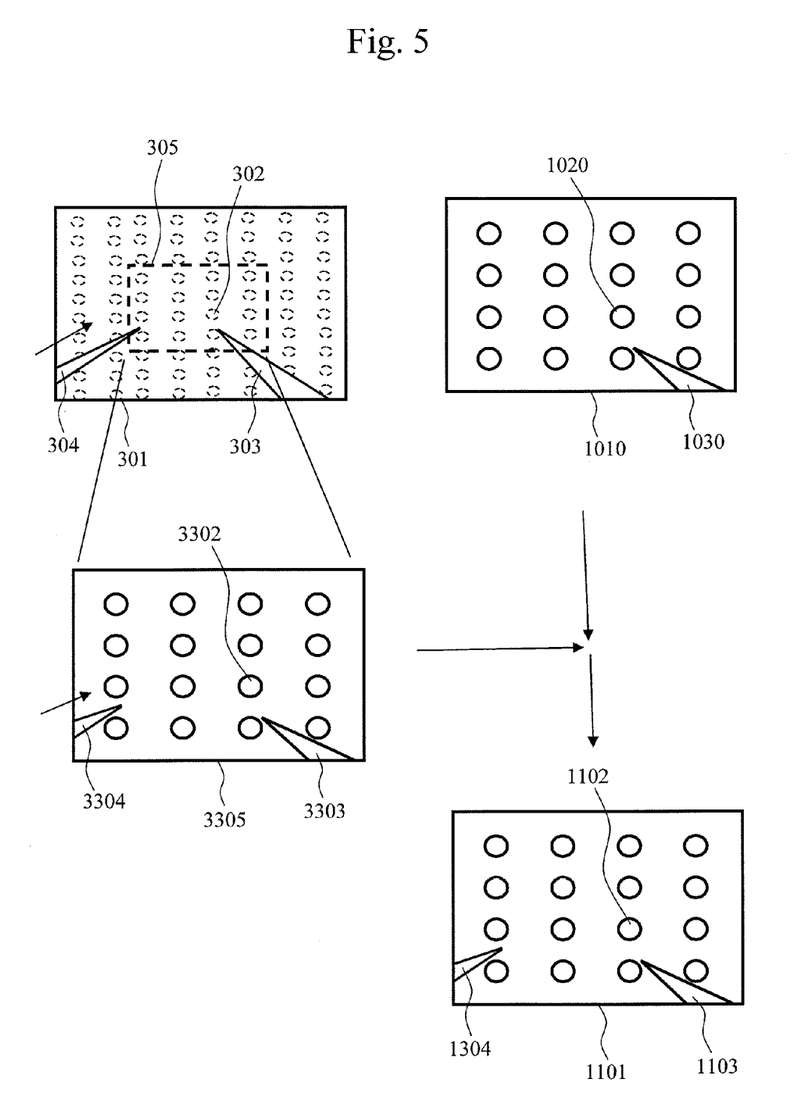
FIG. 5 is a drawing used to describe a first embodiment of a method for generating a high-magnification SEM image for fine access mode observation in the inspection method of the present invention.

A first embodiment of the method for generating the SEM image for high-magnification fine access mode observation in step S108 of FIG. 3 will be described with reference to FIG. 5. An SEM image 301 in the upper-left corner of FIG. 5 represents an example of the third SEM image 301 acquired in step S107 of FIG. 3. In the third SEM image 301, the leading end of a second probe image 304, when compared with the second SEM image 2010 shown in the upper-left corner of FIG. 4, is moved as far as into the central region 305 of the third SEM image 301.

Figure 3:
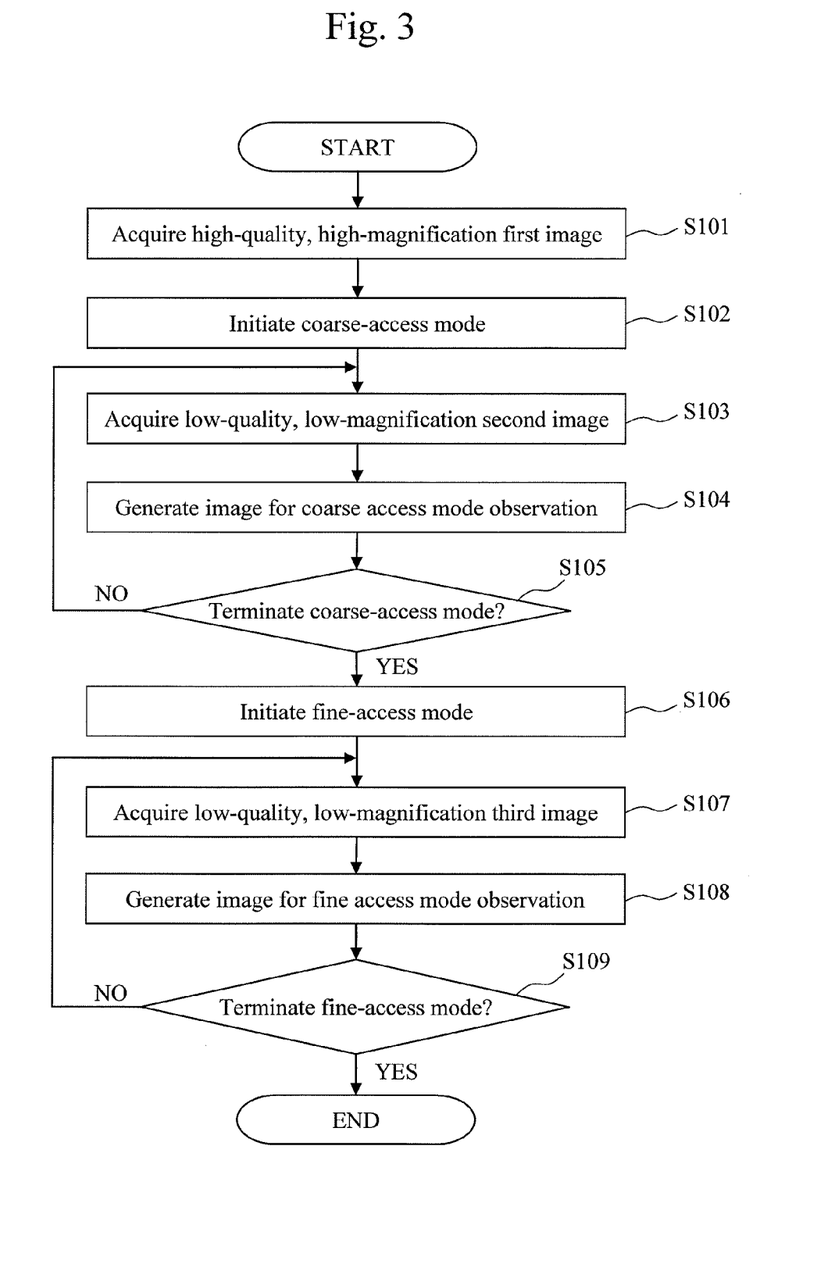
FIG. 3 is a drawing used to describe a method for moving probes in an inspection method of the present invention.

An SEM image 1010 in the upper-light corner of FIG. 5 represents an example of the first SEM image 1010 acquired in step S101 of FIG. 3.

First, a predetermined region 305 of the third SEM image 301 is clipped and enlarged. Alternatively, the third SEM image 301 may be enlarged, and thereby, a portion corresponding to the predetermined region 305 may be clipped. A low-quality enlarged image 3305 the same in magnification as the first SEM image 1010 is generated by combining clipping and enlargement in this way. Here, the magnification of the first SEM image 1010 is advantageously an integral multiple of the magnification of the third SEM image 301.

Not only the target contact image 3302 and the first probe image 3303 but also the second probe image 3304 is displayed in this low-image quality enlarged image 3305. The image-based dimensions of the target contact image 3302 and the first probe image 3303 included in this low-image quality enlarged image 3305 are the same as the image-based dimensions of the target contact image 1020 and the first probe image 1030 included in the first SEM image 1010.

Next, an SEM image 1101 for high-magnification fine access mode observation is generated by synthesizing the low-image quality enlarged image 3305 and the first SEM image 1010. In the synthesis of the two images, the corresponding pixel values of both images, for example, may be integrated.

Not only the target contact image 1102 and the first probe image 1103 but also the second probe image 1304 is displayed in the SEM image 1101 for fine access mode observation. The target contact image 1102 and the first probe image 1103 are images generated using the pixel data of the first SEM image 1010 and is, therefore, crisp. The second probe image 1304 is an image generated using the pixel data of the low-image quality enlarged image 3305 and is, therefore, more or less blurred. As described above, however, the probes are in focus in the third SEM image 301. The second probe image 3304 is therefore relatively crisp. Accordingly, the second probe image 1304 in the SEM image 1101 for fine access mode observation is relatively crisp.

In the present embodiment, the third SEM image 301 is acquired at predetermined time intervals to generate the SEM image 1101 for high-magnification fine access mode observation. Consequently, it is possible to check that the second probe image 1304 has come into contact with the target contact image 1102.

Figure 6:
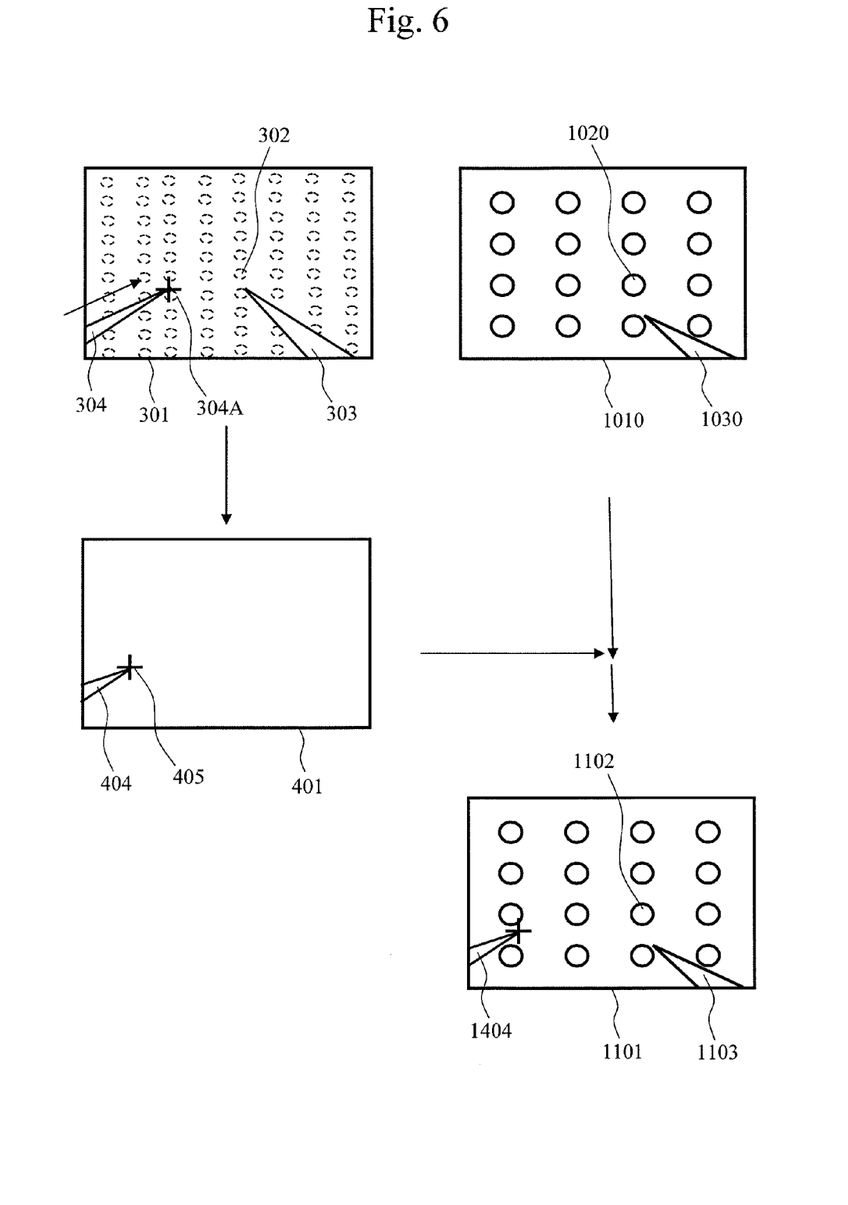
FIG. 6 is a drawing used to describe a second embodiment of the method for generating a high-magnification SEM image for fine access mode observation in the inspection method of the present invention.

A second embodiment of the method for generating the SEM image for high-magnification fine access mode observation in step S108 of FIG. 3 will be described with reference to FIG. 6. An SEM image 301 in the upper-left corner of FIG. 6 represents an example of the third SEM image 301 acquired in step S107 of FIG. 3. An SEM image 1010 in the upper-right corner of FIG. 6 represents an example of the first SEM image 1010 acquired in step S101 of FIG. 3.

First, the position of a leading end 304A of the second probe image 304 is determined in the third SEM image 301 to detect the coordinates of the position. This process is performed by means of image processing by the image processing unit 131. The image processing unit 131 first detects the outline of the second probe image 304 by means of image processing to determine the position of the leading end of the second probe image 304. The coordinates (x1, y1) of the leading end of the second probe image 304 in the coordinate system of low-magnification images are obtained in this way.

Next, the image processing unit 131 converts coordinates (x1, y1) in the coordinate system of low-magnification images to coordinates (x2, y2) in the coordinate system of the first SEM image 1010. Consequently, there are obtained the coordinates (x2, y2) of the leading end of a second probe image in the high-quality, high-magnification coordinate system.

Next, a high-magnification screen 401 the same in magnification as the first SEM image 1010 is created. A method for creating the high-magnification screen 401 will not be described in detail here. For example, the same method as the method for generating the SEM image 3305 shown in FIG. 5 may be used. A second probe image 404 is added to this high-magnification screen 401. The second probe image 404 should be added so that the leading end thereof is placed in a position 405 corresponding to the coordinates (x2, y2) in the coordinate system of the high-magnification screen 401.

The probe image 404 may be a probe image previously prepared by the image processing unit 131 or a probe image generated by clipping the probe image 304 of the third SEM image 301.

Finally, the high-magnification screen 401 including the probe image 404 and the first SEM image 1010 are synthesized to generate the SEM image 1101 for high-magnification fine access mode observation. The target contact image 1102, the first probe image 1103 and the second probe image 1404 are displayed in this SEM image 1101 for fine access mode observation.

Figure 7:
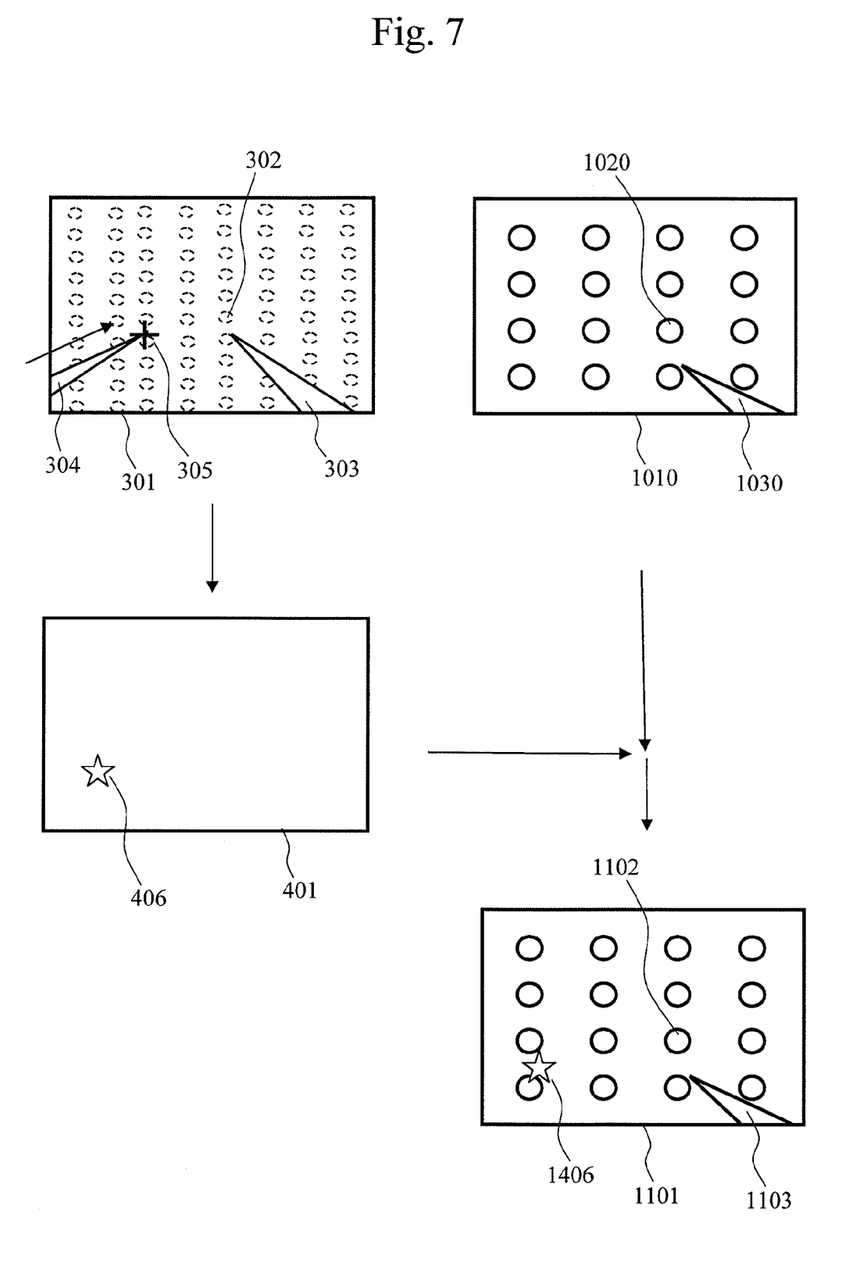
FIG. 7 is a drawing used to describe a third embodiment of the method for generating a high-magnification SEM image for fine access mode observation in the inspection method of the present invention.

A third embodiment of the method for generating the SEM image for high-magnification fine access mode observation in step S108 of FIG. 3 will be described with reference to FIG. 7. The present embodiment is the same as the embodiment of FIG. 6 in steps up to the step of generating the high-magnification screen 401 and acquiring the coordinates (x2, y2) of the leading end 304A of the second probe image 304 in the high-magnification coordinate system. In the present embodiment, a marker 406 is generated instead of displaying the second probe image on the high-magnification screen 401. A marker 1406 representing the second probe image is displayed in the first SEM image 1010, instead of displaying the second probe image.

Use of the marker 1406 makes various advantages available. First, a process of synthesizing two SEM images can be omitted. In general, when two images are synthesized, the magnification of one image is preferably an integral multiple of the magnification of the other image, in order to avoid distortion in images and prevent degradation in image quality. That is, restrictions apply to the magnifications of the two images. Use of the marker 1406 eliminates the step of synthesizing two images, however. Thus, it is possible to freely select the magnifications of the two SEM images 1010 and 301.

Note that the outlines of the probes remain undefined, whereas the position of the leading end of each probe can be determined when the marker 1406 is used. Accordingly, the probes may come into contact with each other to become damaged. In order to prevent the probes from such damage, the marker 1406 should have the same shape as the outline of each probe. The outline of each probe can be represented simply by using two straight lines. Consequently, it is easy to create a marker having a shape similar to or the same as the outline of each probe.

For ease of description, a case has been described here in which only a second probe is moved without moving a first probe. The method also holds true for a case, however, in which a plurality of probes is moved.

A method for reacquiring (refreshing) a high-quality, high-magnification SEM image in the semiconductor inspection device of the present invention will be described with reference to FIG. 8. Charged particle beam images and SEM images may vary with the lapse of time due to drift. Accordingly, it is preferable to once again acquire a new high-image quality, high-magnification SEM image when a predetermined time lapses after a high-quality, high-magnification SEM image is acquired in step S101 of FIG. 3.

Figure 8:
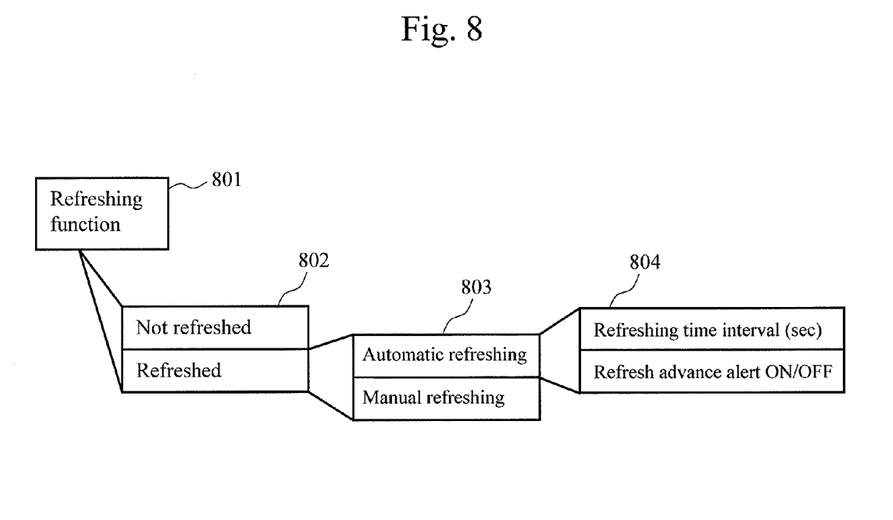
FIG. 8 is drawing used to describe a process of reacquiring (refreshing) a high-quality, high-magnification SEM image in the inspection method of the present invention.

FIG. 8 illustrates variations of user selection at the time of reacquiring (refreshing) a high-quality, high-magnification SEM image. A reacquisition (refresh) function 801 provided in the semiconductor inspection device enables selection 802 as to whether or not the SEM image is refreshed, and selection 803 as to whether refreshing is performed automatically or manually when the SEM image is refreshed. In addition, a refreshing interval of time can be set when refreshing is performed automatically. The refreshing interval of time needs to be varied depending on the type of high-quality, high-magnification SEM image and the type of sample. Yet additionally, the reacquisition function can be set so as to issue an advance alert at the time of refreshing. These settings can be selected by a user on a sample-by-sample basis.

While the embodiments of the present invention have been described heretofore, the present invention is not limited to the above-described embodiments. It will be readily appreciated by those skilled in the art that various modifications are possible within the scope of the present invention as defined by the claims appended hereto.

REFERENCE SIGNS LIST

101: Primary electron beam, 103: Sample, 104: Secondary electron detector, 105: Sample chamber, 118: Electron-beam optical system, 111: Electron gun, 112, 113: Condenser lens, 114: Aperture diaphragm, 115: Scan deflector, 116: Image shift deflector, 117: Objective lens, 121: Base, 122: Large stage, 123: Sample stage driving unit, 124: Sample stage, 125A, 125B: Probe driving unit, 126A, 126B: Probe attachment, 127A, 127B: Probe, 131: Image processing unit, 132: Storage device, 133: Display unit, 134: Control computer, 203: Substrate, 204: Oxide film, 205: Drain, 206: Source, 207: Gate, 208: Contact, 209: Electron beam penetrating region

The invention claimed is:

1. An inspection method for inspecting electrical characteristics of an inspection object by bringing a probe into contact with a target position in the inspection object on a sample, the method comprising:
    a first image acquisition step of acquiring a high-quality, high-magnification first image of the target position in the inspection object on the sample by using a scanning electron microscope;
    a second image acquisition step of acquiring a low-quality, low-magnification second image of the target position in the inspection object on the sample and the probe by using the scanning electron microscope;
    a first image reduction step of reducing the first image so as to be the same in magnification as the second image, thereby generating a reduced image; and
    a coarse-access observation image generation step of synthesizing the reduced image and the second image to generate an image for coarse-access observation comprising the target position included in the reduced image and the probe included in the second image and bein the same in magnification as the second image,
    wherein the second image acquisition step, the first image reduction step, and the coarse-access observation image generation step are repeated as the probe is moved toward the target position until a determination is made that a distance between the target position in the inspection object and the probe is smaller than a predetermined value in the image for coarse-access observation.

2. The inspection method according to claim 1, wherein the first image is acquired by bringing into focus the target position in the inspection object on the sample and the second image is acquired by bringing the probe into focus.

3. The inspection method according to claim 1, comprising:
- a third image acquisition step of acquiring a low-quality, low-magnification third image of the target position in the inspection object on the sample and the probe by using the scanning electron microscope;
- a third image enlargement step of clipping a region comprising the target position and the probe from the third image and enlarging the region so as to be the same in magnification as the first image, thereby generating an enlarged image; and
- a fine-access observation image generation step of synthesizing the enlarged image and the first image to generate an image for fine-access observation comprising the target position included in the first image and the probe included in the enlarged image and being the same in magnification as the first image,
- wherein the third image acquisition step, the third image enlargement step, and the fine-access observation image generation step are repeated as the probe is moved toward the target position until a determination is made that the probe has come into contact with the target position in the inspection object in the image for fine-access observation.

4. The inspection method according to claim 1, comprising:
- a third image acquisition step of acquiring a low-quality, low-magnification third image of the target position in the inspection object on the sample and the probe by using the scanning electron microscope;
- a position detection step of detecting the position of the probe from the third image by means of image processing, thereby detecting the position of the probe in the coordinate system of the first image;
- a high-magnification image generation step of generating a high-magnification image the same in magnification as the first image;
- a probe image synthesis step of synthesizing an image of the probe from the third image with the high-magnification image; and
- a fine-access observation image generation step of synthesizing the high-magnification image with which the probe image is synthesized and the first image to generate an image for fine-access observation comprising the target position included in the first image and the probe image included in the high-magnification image and being the same in magnification as the first image,
- wherein the third image acquisition step, the position detection step, the probe image synthesis step, and the fine-access observation image generation step are repeated as the probe is moved toward the target position until a determination is made that the probe has come into contact with the target position in the inspection object in the image for fine-access observation.

5. The inspection method according to claim 4, wherein the probe image to be synthesized with the high-magnification image in the probe image synthesis step is either generated by clipping the probe image from the third image or an image previously created by means of image processing.

6. The inspection method according to claim 1, comprising:
- a third image acquisition step of acquiring a low-quality, low-magnification third image of the target position in the inspection object on the sample and the probe by using the scanning electron microscope;
- a position detection step of detecting the position of the probe from the third image by means of image processing, thereby detecting the position of the probe in the coordinate system of the first image; and
- a fine-access observation image generation step of displaying a marker at the position of the probe in the first image, thereby generating an image for fine-access observation comprising the target position included in the first image and the marker and being the same in magnification as the first image,
- wherein the third image acquisition step, the position detection step, and the fine-access observation image generation step are repeated as the probe is moved toward the target position until a determination is made that the probe has come into contact with the target position in the inspection object in the image for fine-access observation.

7. The inspection method according to claim 3, wherein the first image is acquired by bringing into focus the target position in the inspection object on the sample and the third image is acquired by bringing the probe into focus.

8. The inspection method according to claim 1, wherein the first image is reacquired after a predetermined period of time elapses.

9. The inspection method according to claim 1, wherein the high-quality image is acquired by either
  (i) changing at least one of the acceleration voltage of an electron beam, an irradiation current, a probe current, a scan speed, the frequency of frame integration, and the number of pixels, or
  (ii) selecting one of a secondary electron image, a reflected electron image and a particle beam image.

10. The inspection method according to claim 1, comprising a step of performing a graphics editing process on the first image, so as to discriminate an image derived from the first image, among images included in the image for coarse-access observation, from other images.

11. An inspection method for inspecting electrical characteristics of an inspection object by bringing a probe into contact with a target position in the inspection object on a sample, the method comprising:
- a first image acquisition step of acquiring a high-quality, high-magnification first image of the target position in the inspection object on the sample by using a scanning electron microscope;
- a step of initiating a coarse-access mode in which the probe is moved at a first moving speed or stroke;
- a second image acquisition step of acquiring a low-quality, low-magnification second image of the target position in the inspection object on the sample and the probe by using the scanning electron microscope;
- a coarse-access observation image generation step of incorporating data of the first image into the second image to generate an image for coarse-access observation comprising the target position and the probe and being the same in magnification as the second image;
- a step of initiating a fine-access mode in which the probe is moved at a second moving speed or stroke;
- a third image acquisition step of acquiring a low-quality, low-magnification third image of the target position in the inspection object on the sample and the probe by using the scanning electron microscope; and
- a fine-access observation image generation step of incorporating data of the third image into the first image to generate an image for fine-access observation comprising the target position included in the first image and the probe obtained from the data of the third image and being the same in magnification as the first image.

12. The inspection method according to claim 11, wherein the second image acquisition step and the coarse-access observation image generation step are repeated as the probe is moved toward the target position until a determination is made that a distance between the target position in the inspection object and the probe is smaller than a predetermined value in the image for coarse-access observation.

13. The inspection method according to claim 11, wherein the third image acquisition step and the fine-access observation image generation step are repeated as the probe is moved toward the target position until a determination is made that the probe has come into contact with the target position in the inspection object in the image for fine-access observation.

14. The inspection method according to claim 11, wherein the first image is acquired by bringing into focus the target position in the inspection object on the sample and the second and third images are acquired by bringing the probe into focus.

15. The inspection method according to claim 11, wherein the first image is reacquired after a predetermined period of time elapses.

16. An inspection device comprising;
a sample stage to be mounted with a sample;
an electron beam irradiation optical system for irradiating an electron beam to the sample;
a detector for detecting a secondary electron or a reflection electron generated from the sample;
an image processing unit for generating a sample image on the basis of a signal from the detector;
a storage device for storing the sample image;
a display unit for displaying the sample image;
a deflecting coil for varying the magnification of the sample image;
at least one probe to be brought into contact with the sample; and
a probe driving unit for driving the probe, and the inspection device being adapted to inspect electrical characteristics of an inspection object by bringing the probe into contact with a target position in the inspection object on the sample,
wherein the inspection device is configured to acquire a high-quality, high-magnification first image of the target position in the inspection object on the sample, acquire a low-quality, low-magnification second image of the target position in the inspection object on the sample and the probe, reduce the first image so as to be the same in magnification as the second image, thereby generating a reduced image, and synthesize the reduced image and the second image to generate an image for coarse-access observation comprising the target position included in the reduced image and the probe included in the second image and being the same in magnification as the second image,
wherein the acquisition of the second image, the generation of the reduced image, and the generation of the image for coarse-access observation are repeated as the probe is moved toward the target position until a determination is made that a distance between the image of the target position in the inspection object and the probe image is smaller than a predetermined value in the image for coarse-access observation.

17. The inspection device according to claim 16, wherein the inspection device is configured to
acquire a low-quality, low-magnification third image of the target position in the inspection object on the sample and the probe;
clip a region comprising the target position and the probe from the third image and enlarge the region so as to be the same in magnification as the first image, thereby generating an enlarged image; and
synthesize the enlarged image and the first image to generate an image for fine-access observation comprising the target position included in the first image and the probe included in the enlarged image and being the same in magnification as the first image,
wherein the acquisition of the third image, the generation of the enlarged image, and the generation of the image for fine-access observation are repeated as the probe is moved toward the target position until a determination is made that the probe has come into contact with the target position in the inspection object in the image for fine-access observation.

18. The inspection device according to claim 17, wherein the first image is acquired by bringing into focus the target position in the inspection object on the sample and the second and third images are acquired by bringing the probe into focus.

19. The inspection device according to claim 16, wherein the first image is reacquired after a predetermined period of time elapses.

20. The inspection device according to claim 16, wherein the high-quality image is acquired by either
(i) changing at least one of the acceleration voltage of an electron beam, an irradiation current, a probe current, a scan speed, the frequency of frame integration, and the number of pixels, or
(ii) selecting one of a secondary electron image, a reflected electron image and a particle beam image.

* * * * *